(12) United States Patent
Glibbery

(10) Patent No.: US 7,129,879 B1
(45) Date of Patent: Oct. 31, 2006

(54) METHOD OF AND APPARATUS FOR CHARACTERIZING AN ANALOG TO DIGITAL CONVERTER

(75) Inventor: Adam Glibbery, Basingstoke (GB)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 11/179,096

(22) Filed: Jul. 12, 2005

(51) Int. Cl.
H03M 1/12 (2006.01)
G06F 1/02 (2006.01)

(52) U.S. Cl. .................. 341/155; 708/274
(58) Field of Classification Search .......... 341/120, 341/118, 155; 708/270, 274, 200, 232
See application file for complete search history.

(56) References Cited

U.S. PATENT DOCUMENTS

| 4,814,767 | A | | 3/1989 | Fernandes et al. | |
|---|---|---|---|---|---|
| 5,656,800 | A | * | 8/1997 | Naito et al. | 177/25.13 |
| 5,712,633 | A | * | 1/1998 | Bae | 341/120 |
| 5,754,139 | A | * | 5/1998 | Turcotte et al. | 342/373 |
| 5,991,106 | A | * | 11/1999 | Ohmori | 360/46 |
| 6,351,231 | B1 | * | 2/2002 | Price et al. | 341/155 |
| 6,445,317 | B1 | * | 9/2002 | Lundin et al. | 341/120 |
| 6,476,741 | B1 | * | 11/2002 | Cherubal et al. | 341/120 |
| 6,885,323 | B1 | * | 4/2005 | Batruni | 341/118 |

* cited by examiner

Primary Examiner—Peguy JeanPierre
(74) Attorney, Agent, or Firm—Wolf, Greenfield & Sacks, P.C.

(57) ABSTRACT

An apparatus for characterising an analog to digital converter, comprising a signal generator for supplying an input signal having a first sinusoidal component to an analog to digital converter and an acquisition device for receiving and storing a plurality of output values from the analog to digital converter, and a data processor arranged to examine the output values in order to determine discrepancies due to bit weight errors and to calculate estimates of the bit weights or bit weight errors.

24 Claims, 2 Drawing Sheets

METHOD OF AND APPARATUS FOR CHARACTERIZING AN ANALOG TO DIGITAL CONVERTER

TECHNICAL FIELD

The present invention relates to a method of and apparatus for characterising an analog to digital converter.

BACKGROUND OF THE INVENTION

Commercially produced analog to digital converters (ADCs) and digital to analog converters (DACs) can suffer from output errors where for a given input, the output produced by the converter differs from the ideal or expected output value. This error can arise due to mismatch between the "bit weights" in a converter. The mismatch may be caused by process variations during fabrication of the converter, or simply due to scaling effects and parasitic capacitances within the semiconductor die used for the converter.

If the relative bit weights are known, it is possible to wholly or partially correct the operation of the ADC or DAC, for example by applying digital correction to the output of a DAC or ADC respectively, or by using programmable fuses to connect trimming capacitors to the ADC array to adjust component values after fabrication. However it can be costly to determine bit weights especially in high resolution devices as expensive test equipment and long test times may be required. Also, the presence of noise can make bit weight measurement unreliable. This may result in further tests being required in order to reduce the impact of noise.

SUMMARY OF THE INVENTION

According to a first aspect of the present invention there is provided a method of characterizing an analog to digital converter, comprising:

a). An acquisition step comprising supplying an input signal to having a first sinusoidal component to an analog to digital converter and obtaining a plurality of output values therefrom, and b). An analysis step comprising examining the output values in order to determine discrepancies due to bit weight errors and obtain estimates of the bit weights or the bit weight errors.

It is thus possible to provide a characterisation technique which avoids the need for high precision ramp generators.

Preferably the input signal contains substantially only the first sinusoidal component.

Hitherto analog to digital converters have been characterised by supplying a ramp signal to the analog to digital converter, and by examining the output of the converter to see how its digital approximation of a nominally linear output varies from the ideal. However, it is difficult to produce a truly linear ramp signal as an input to the converter. On the other hand, sinusoids can be generated inexpensively. Band pass filters may be used to substantially remove harmonics from a periodic signal allowing even inexpensive signal generators using, for example, digital to analog converters to generate a digital approximation of a sinusoid, to be used as the source of a sufficiently high quality well characterised sinusoid. The present invention allows a sinusoid to be used (or a signal having a well characterised periodic nature and that may be described by a few sinusoidal components) as an input signal. This enables a reliable characterisation to be performed using inexpensive signal sources.

A sinusoid having a well defined frequency can be produced by digital synthesis of the sinewave. In this technique a digital approximation of a sinewave is provided to a DAC. The rate at which the DAC updates its output is accurately derived from the clock of the digital system and hence the frequency is well controlled. Any digital approximation will introduce harmonics which constitute unwanted components into the output signal. In order to remove these harmonic components the DAC output is passed through a low pass or preferably a band pass filter leaving in all probability the fundamental and a few low amplitude lower order harmonic components. The filter will almost certainly cause a change in amplitude of the signal and will also introduce a phase shift. However, the phase shift can be compensated for as will be explained later.

Advantageously the representation of the sinusoid is stored in a memory, such as a ROM, which is clocked to provide an input to the DAC.

Preferably the step of examining the output values comprises a comparison of a given output value with a corresponding input value. This comparison may, as will be explained later, include a correction for phase shifts. This means that, in the digital domain, the $i_{th}$ ADC output value may not necessarily come from the $i_{th}$ DAC input value (assuming that the sinusoid is generated by a DAC) and that an offset between the input and output values may be required.

Advantageously a conversion is performed over a plurality of cycles of the sinusoid. Thus, many thousands of samples may be taken in a single data acquisition pass.

Advantageously the sampled data is stored in an array $A_j$, j=1 to N.

It is known (and will be shown) that the relationship between the analog value and the digital value at the input and output, respectively, of an ideal ADC can be expressed in Matrix terms as $$b = Ax$$

where b is a vector (column matrix) containing analog sample/input values;

x is a vector containing the bit weights of the converter; and

A is a matrix of the digital word values, where each row in the matrix a corresponds to a respective row in b.

The vector b is a linear combination of the column vectors in A. This means that vector b lies within with the column space of A.

For a system where we make M conversions using a N bit ADC we have matrix A having dimensions M×N and M×1 b matrix. It can be said that we have an $R^m$ system as each column vector in A has M elements. With a full column rank we have a subspace dimension of N. In this system where N<M, the system is over specified and we will see either one solution or no solutions. In fact, in the presence of noise the vector b does not quite lie in the column space of A. However, in order to find solutions to the above equation we would like to project b into the column space. This can mathematically be done by adding a further vector e to be that is orthogonal to the column space.

We will rely on the known fact that if vectors X and Y are orthogonal then $X^T y = 0$, and hence in the present situation $A^T e = 0$.

During the characterisation process the values of b are known because they are provided from the test equipment and the values of A are known because these are the output results from the converter. It should therefore be possible to deduce the values in x. Given a sufficient number of samples, then various mathematical or numerical techniques would yield solutions. For example, a numerical search process may be performed to determine a fitted approximation to the bit weights $\hat{x}$ (the "^" refers to the fitted weights) using a starting assumption that the actual value of each bit is close to its nominal value. The ideal and actual values can be calculated for each sample and the error between them formed. A sum of the square of each error can then be formed and this can be used as a metric to determine how well the real bit values approximate the ideal bit values. If the bit values were ideal then, in the absence of any noise, the sum of the squares of the individual differences would be zero. However, in the presence of noise this sum will be non-zero even if all of the bits corresponded exactly to their ideal weights. It is then possible to examine the effect of dithering the weights, either individually or several at a time, and to recalculate the sum of the square of the error values. Those changes, when compared to the size of the dither, can be used to calculate a gradient (rate of change) for the bit under test and the gradient and sum of the squared errors can be examined to estimate the change to the bit value that should minimise the error. This process, whilst conceptually simple, is iterative and may involve significant computation. However on modern data processing systems this computation may be performed sufficiently promptly for this not to be an issue.

However more elegant mathematical and numerical techniques exist and may be employed by the person skilled in the art in accordance with their own skills and/or prejudices.

Preferably the bit values are performed by evaluating the equation $$\hat{x}=(A^T A)^{-1} A^T b$$

This equation is susceptible to rapid evaluation within a data processor, and can make use of standard numerical tools such as matrix inversion routines which are well known and readily available to the person skilled in the art without requiring then to understand the internal workings of the matrix inversion process.

Advantageously the input signal is a sinusoid derived from a digital signal generator such that the frequency of the sinusoid is well determined. The use of such a generator might give rise to quantisation issues although this, when looked at in frequency domain, is likely to manifest itself as an increased magnitude of higher order harmonic components. It is important for this determination that the frequency of the sinusoid is accurately known. It is not a requirement that the amplitude of the input signal be well controlled, although it is preferable that it is substantially constant over the duration of a data acquisition pass.

Preferably b is populated with calculated sinusoid values, or the values that were used to drive a DAC of the signal generator.

The phase of the analog input signal must be known and may have become changed by passage through a filter so account needs to be taken of this potential change. Additionally therefore A contains a column of cosine values at the same frequency as the values in b (which is also the frequency of the analog input signal). $\hat{x}$ also contains a cosine factor term in the row r that corresponds to the column of the cosine values in A. Thus when we solve for $\hat{x}$, the calculation will take into account any phase change in the analog input signal to the ADC and provide its relative magnitude as a cosine factor in $\hat{x}$. Thus the input sinusoid can be of unknown phase.

Although a band pass filter is preferably used to remove harmonics, it is possible that harmonic frequencies may leak through the band-pass filter into the input of the ADC under test. The input stage of the ADC may itself be a source of harmonics. These can also be accounted for in the calculation by adding further columns to A. If it is desired to cancel effects from a harmonic at H times the fundamental frequency, two columns are added to A corresponding to a sine and cosine factors of the harmonic at H times the fundamental frequency. In this way the magnitude and phase of the harmonic need not be known.

The analog input signal can alternatively any well defined periodic signal, or any other repetitive predetermined input signal that can be described by a finite number of orthogonal components. The vector b must contain a representation of the input signal, or at least those components which are not represented by a column in A and a corresponding factor in $\hat{x}$.

Additionally, an offset may be accounted for in the equation by adding a non-zero constant value, for example a column of 1's, to the matrix A and adding a corresponding offset factor to $\hat{x}$ (i.e. the offset factor is in the same row number as the column number of the column of 1's). In this way, the presence of a constant offset between the input analog value and output digital value will not affect the bit weights in $\hat{x}$, and its relative magnitude will be calculated as the offset factor in $\hat{x}$. This is particularly useful where the offset is not known.

It should be noted that the solution presented herein does not inherit any assumptions about the internal architecture of the converter. Thus the invention is not limited to ADC converters having a binary weighted capacitor array. The invention can be used with converters having other weightings, such as a radix of less than 2, for example around 1.8, or/and it can also be used with converters that include redundant bits.

According to a second aspect of the present invention there is provided an apparatus for characterising an analog to digital converter, comprising a signal generator for supplying an input signal having a first sinusoidal component to an analog to digital converter and an acquisition device for receiving and storing a plurality of output values from the analog to digital converter, and a data processor arranged to examine the output values in order to determine discrepancies due to bit weight errors and to calculate estimates of the bit weights or bit weight errors. According to a further aspect of the present invention there is provided a method of trimming an analog to digital converter, comprising the steps of:

1) an acquisition step comprising supplying an input signal to an analog to digital converter and obtaining a plurality of output values therefrom:
2) comparing the input signal and the output values for a plurality of samples to determine the relative bit weights within the converter: and
3) trimming the bits within the converter on the basis of the bit weights.

Preferably the step of comparing the input signal and the output values comprises a least squares fitting procedure or a solution of simultaneous equations in order to determine the bit weights.

Preferably the trimming step includes digital trimming of bit weights by associating trimming capacitors with the bit weights (as is known in the art) or by analog trim methods such as trimming of the capacitors in the ADC array or the addition of trim words (offsets) to the input of the array.

The input signal may be a substantially linear ramp signal that does not necessarily have to have full code coverage. Thus for an N bit binary ADC the number of samples taken can also be less than 2^N. Although noise performance is improved with more samples, taking fewer samples can help reduce errors due to correlated sample artifacts. The substantially sinusoidal input test is preferable as it's nature acts to reduce the correlated sample errors.

BRIEF DESCRIPTION OF THE DRAWINGS

The invention will now be described by way of example only with reference to the accompanying drawings, in which.

DETAILED DESCRIPTION OF PREFERRED EMBODIMENTS OF THE INVENTION

Figure 1:
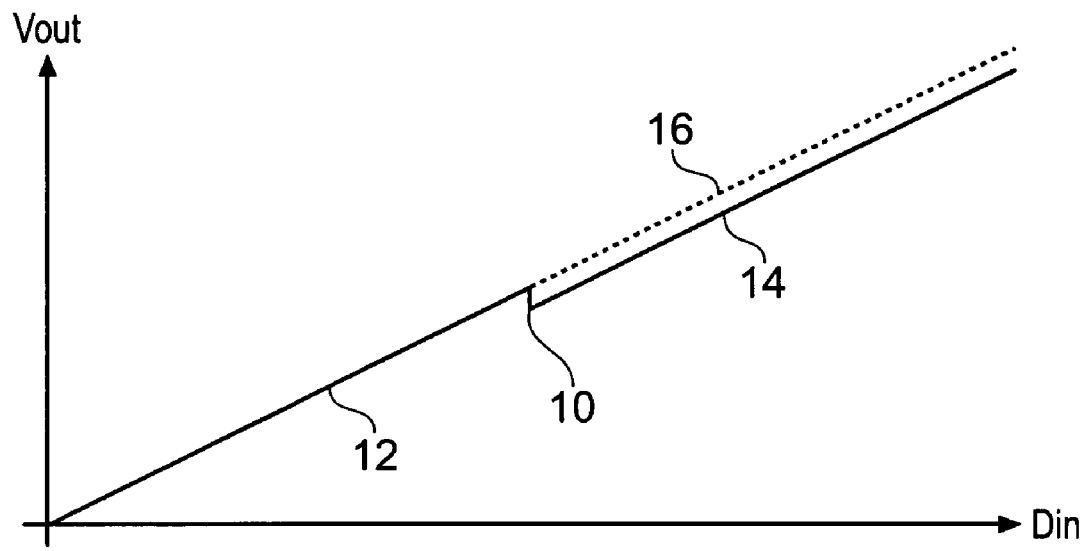
FIG. 1 shows the transfer function of a DAC with a single bit weight error.

Before considering the characterisation of analog to digital converters, it is informative to consider the effect of bit weight errors in digital to analog converters. Suppose that an uncorrected DAC is supplied with an incrementing digital input such that its output should be a straight line. However the DAC has a bit-weight error associated with its most significant bit (MSB). In this example the MSB is "underweight", that is it provides less of a contribution to the output than its ideal weight, resulting in a transient error 10 as shown in FIG. 1 at the transition from 01111111 so 1000000 (in the case of an 8 bit converter) half-way through the full range of DAC. All other bits are accorded the correct weights. As a result, up to the transient error 10 the analog output follows an ideal line 12. Above the transient 10, the output follows a line 14 which is offset from an ideal output 16. Other factors such as noise and a constant offset value between the input and output are not considered for this theoretical analysis.

Figure 2:
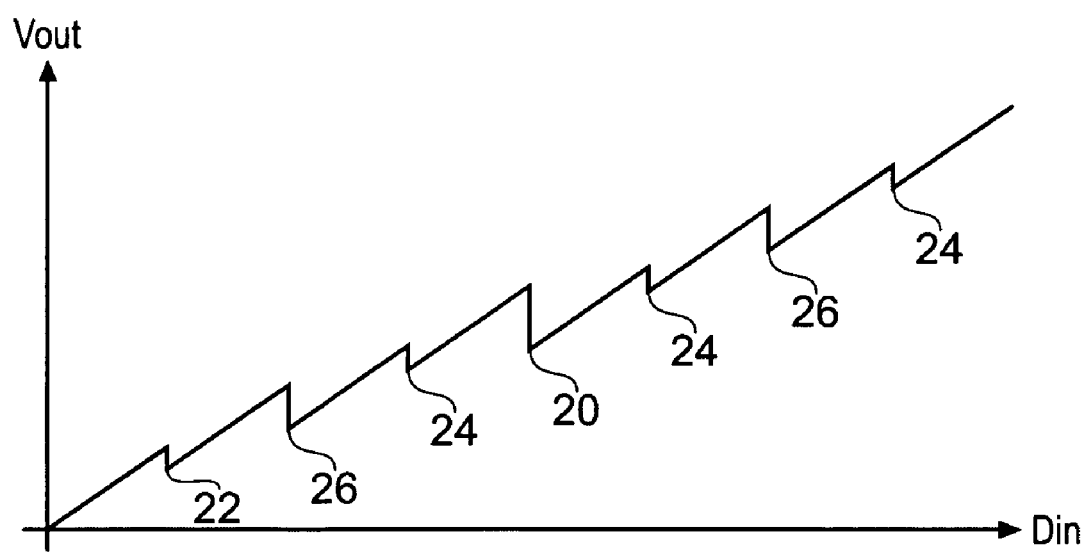
FIG. 2 shows the transfer function of a DAC with multiple bit weight errors.

FIG. 2 shows a more complex example of the analog output from a DAC in which the bit weights of the most significant three bits differ from their ideal values. This gives rise to a series of transitions 20, 22, 24 and 26. However the transition 20 at the centre of the full range of the DAC is different to the first transition 22 (due to the third most significant bit) encountered as the input value increases. This is because the transition 20 is due to bit weight errors of all three most significant bits. Bit weights are therefore additive at certain points and can lead to a significant error in the output. The bit weight error of the third most significant bit also contributes to transitions 24 and 26 on the graph of FIG. 2, and the bit weight error of the second most significant bit also contributes to the transitions 26.

If the relative bit weights of the bits in the DAC are determined, then the DAC can be adjusted to correct the errors. A known method of determining the relative bit weights of a DAC is to provide the DAC with a digital "ramp" input and taking periodic samples of the analog output. The output samples can then be examined for transitions such as those in FIGS. 1 and 2, which will reveal relative bit weight errors. In the presence of noise, multiple readings must be taken to ensure accuracy of the results.

An ADC can similarly have relative bit weight errors. These are traditionally determined by applying an analog ramp input to the ADC and taking a sequence of samples of the digital output. The output samples can be examined to determine bit weight errors. However producing well-controlled analog ramp input is a difficult task requiring expensive test equipment. Tests must also be repeated to reduce or eliminate the effects of noise.

Repeat testing of a DAC or ADC increases test time and hence cost.

Mathematically the operation of an ideal ADC or DAC can be represented as:

$$b = Ax \qquad \text{Equation 1}$$

where b is a vector containing analog values

A is a matrix containing rows of digital values corresponding to status of the bits, and x is a vector containing the bit weights of the converter.

Thus a 3-bit converter can be represented as $$\begin{bmatrix} 0 \\ 1 \\ 2 \\ 3 \\ 4 \\ 5 \\ 6 \\ 7 \end{bmatrix} = \begin{bmatrix} 000 \\ 001 \\ 010 \\ 011 \\ 100 \\ 101 \\ 110 \\ 111 \end{bmatrix} \begin{bmatrix} 4 \\ 2 \\ 1 \end{bmatrix} \qquad \text{Equation 2}$$

In a DAC, b represents output values and A represents input values used to set the bits, whereas in an ADC b represents input values and A represents the bit values following completion of the bit trials.

The goal is to find x for a converter under test where A and b have already been determined or measured. In the context of characterising an ADC it can be seen that we are effectively seeking to solve a set of simultaneous equations where $$A_{1,4}x_4 + A_{1,3}x_3 + A_{1,2}x_2 + A_{1,1}x_1 = b_1$$

$$A_{2,4}x_4 + A_{2,3}x_3 + A_{2,2}x_2 + A_{2,1}x_1 = b_2$$

$$A_{3,4}x_4 + A_{3,3}x_3 + A_{3,2}x_2 + A_{3,1}x_1 = b_3$$

$$\vdots$$

$$A_{n,4}x_4 + A_{n,3}x_3 + A_{n,2}x_2 + A_{n,1}x_1 = b_n$$

and $A_{n,m}$ represents the value of A for the $N_{th}$ sample and the $M_{th}$ bit x can be found by taking only three independent rows of A (in a 3-bit converter) and calculating:

$$X = A_R^{-1} b \qquad \text{Equation 3}$$

where $A_R$ is a square matrix containing three rows of A chosen such that the contribution of each bit can be determined. In the context of the present example as AR must be square for an inverse to be calculatable. For a general m-bit converter, AR will contain m rows from A.

This approach has poor noise immunity as very few results are used to calculate the bit weights in x̂. Repeat calculations of x̂ are therefore required from different test results to improve the accuracy of the calculations.

The true relationship between A and b can be expressed as follows:

$$b = A\hat{x} + e \quad \text{Equation 4}$$

where e is a vector of error values between each analog and digital value in b and A respectively. This error arises due to noise and other factors, but not due to bit weight inaccuracies.

In order to find a solution we need to find the projections of the column vectors b that, in a mathematical sense, lie in the column space A. The vector e that we use to form this projection needs to be orthogonal A:

$$A^T e = 0 \quad \text{Equation 5}$$

This can be understood by considering that in the results in A, the error present due to noise in each column of A (corresponding to a single bit) sums to zero for a large number of results.

The above equations can be combined by pre-multiplying Equation 4 by $A^T$ and rearranging it to form:

$$A^T(b - A\hat{x}) = 0 \quad \text{Equation 6}$$

where x̂ represents the fitted weights.

This can be arranged to:

$$A^T A \hat{x} = A^T b \quad \text{Equation 7}$$

ATA is always a square matrix and therefore can have an inverse. Consequently this equation can be written as:

$$\hat{x} = (A^T A)^{-1} A^T b \quad \text{Equation 8}$$

The calculation of x̂ is therefore a relatively simple operation. Furthermore there is no restriction on the size of A (i.e. the number of test results). A large number of test results can therefore be obtained in a single pass. The above equation automatically combines repeat results. Repeated tests are therefore unnecessary. Even though A may contain thousands of test results the matrix ATA is relatively small (for example 12 units square for a 12-bit converter) and calculating its inverse is not a computationally difficult task. It will be shown later that the size increases a little if we allow for offsets and the effect of harmonic components in the input signal.

The calculation requires that a row of output data in A corresponds to the same row of input data in b. In other words, the form of the input signal must be accurately known. The magnitude of the input signal need not be known as the relative bit weights remain unchanged an these can be normalised by dividing each bit weight by the largest bit weight.

Suppose for example, that we have a 3 bit converter and it is likely to exhibit an offset. Also suppose that (for simplicity) we supply a fast ramp signal to the converter such that the converter cannot perform multiple conversions for each of its output codes, and that for a series of five samples we have (where the input values represent a transition value between the output words)

| Input Value | Output Word |
|---|---|
| 0.7052 | 001 |
| 1.4188 | 010 |
| 3.5620 | 101 |
| 4.2762 | 110 |
| 4.9909 | 111 |

If we allow for an offset, then we set up the following matrix $$\begin{bmatrix} 0 & 0 & 1 & 1 \\ 0 & 1 & 0 & 1 \\ 1 & 0 & 1 & 1 \\ 1 & 1 & 0 & 1 \\ 1 & 1 & 1 & 1 \end{bmatrix} \begin{bmatrix} x_2 \\ x_1 \\ x_0 \\ \text{off} \end{bmatrix} = \begin{bmatrix} 0.7052 \\ 1.4188 \\ 3.5620 \\ 4.2762 \\ 4.9909 \end{bmatrix}$$

It can be seen that the first three columns of A correspond to the output words and the fourth column is a constant value for the offset calculation.

This is solved as $$\hat{x}(A^T A)^{-1} A^T b = \begin{bmatrix} 2.8571 \\ 1.4287 \\ 0.7148 \\ -9.75 \text{ m} \end{bmatrix}$$

By scaling our fitted x to its first element we get 1, 0.50005, 0.25020 as the first three rows, and an offset of $-9.75 \times 10^{-3}$.

In the above calculations, each sample in the output sample matrix A must be in the same row as the corresponding input sample in b.

The ADC test can be improved by providing a periodic signal as an input signal so that many samples can be taken, and by extending the calculations such that it is not necessary for the input and output samples to have a strict correspondence. Thus phase shifts in the periodic input signal can be tolerated.

Figure 3:
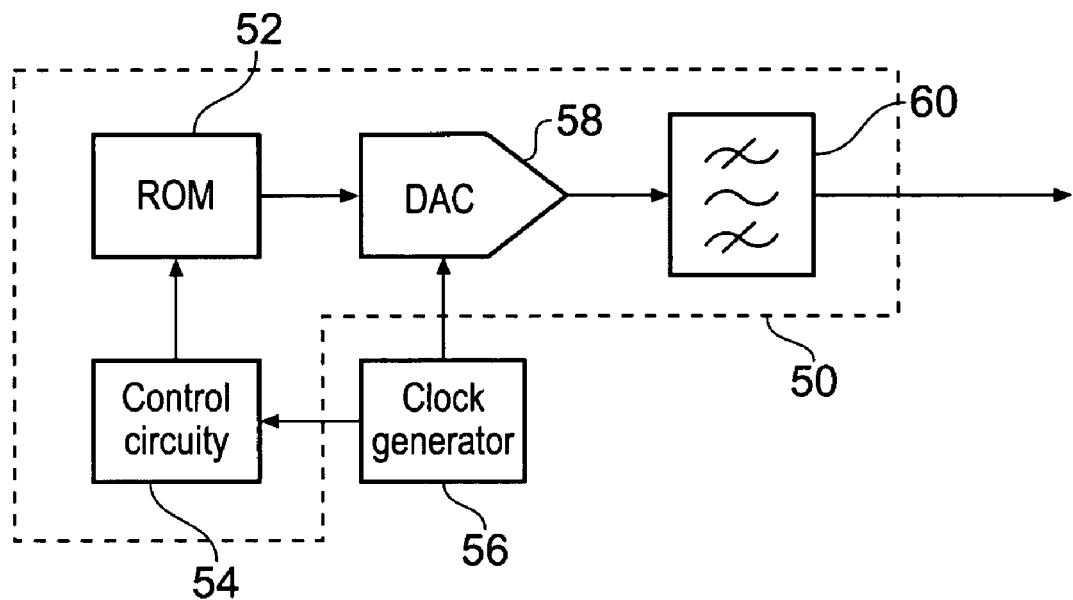
FIG. 3 schematically shows a sinusoidal signal generating apparatus.

The input signal is chosen to be a sinusoid. A sinusoid signal can be very easily and very cheaply produced using apparatus 50 as shown in FIG. 3, by Direct Digital Synthesis (DDS). The apparatus comprises a ROM 52 containing a digital representation of a sinusoidal signal. Only one phase needs to be stored in the ROM 52 as the second phase can be generated by inversion of the first phase. Control circuitry 54 provides an address to the ROM 52, and the ROM outputs the contents of that address. The address is provided by a counter within the control circuitry 54 and is advanced by a clock from a clock generator 56. The counter should have a range of the number of samples within the ROM 52.

The digital output of the ROM 52, which is a sample of a sinusoidal signal, is provided to a DAC 58. The clock from the clock generator 56 is also provided to the DAC 58 to instruct it to sample the digital input and provide a corresponding analogue output. A periodic clock causes a digital approximation of a sinusoid to be output from the ROM 52. The frequency of the sinusoid is accurately related to the clock frequency.

The analog output from the DAC 58 is provided to a narrow-band band-pass filter 60. The centre frequency of the filter 60 is selected to be the frequency of the sinusoid generated by the ROM 52 (or vice versa). The bandwidth of the filter should narrow as we are only interested in obtaining pure sinusoidal signal, so harmonic components should ideally be absent.

The output of the filter 60 is provided to the ADC under test as an input signal. The ADC can be driven using the same clock generated by the clock generator 56. The outputs of the ADC are stored in memory. This causes the matrix A to fill with digital output samples representative of a sinusoid from the ADC, plus any errors due to incorrect bit weights and noise. The vector b is filled with samples of a sinusoid at the same frequency as the sinusoid in A, which will be the frequency of the input sinusoid. The samples in b can be calculated using suitable data processing apparatus or merely read from the ROM 52. Since, after filtering, the fundamental sinusoidal component is made available to the ADC, it is possible to calculate the values to populate b to follow the idealised sinusoid to a greater number of bits than is used in the DAC. Thus calculation is preferred as it effectively reduces quantisation noise.

The phase of the input sinusoid to the ADC is not easily determined. The filter 60 inevitably introduces a phase shift. Such that the phase is not required to be known, A is augmented with a further column containing cosine values which are orthogonal to the sinusoid in b. A corresponding (unknown) cosine magnitude factor is added to x. An example of the equation $b = A\hat{x} + e$ then becomes:

$$\begin{bmatrix} b_1 \\ b_2 \\ b_3 \\ \vdots \end{bmatrix} = \begin{bmatrix} A_{11} & A_{12} & A_{13} & c_1 \\ A_{21} & A_{22} & A_{23} & c_2 \\ A_{31} & A_{32} & A_{33} & c_3 \\ & & \vdots & \end{bmatrix} \begin{bmatrix} x_1 \\ x_2 \\ x_3 \\ M_c \end{bmatrix} + e$$

where $b_1, b_2, b_3 \ldots$ are sinusoid values $c_1, c_2, c_3 \ldots$ are cosine values $M_c$ is the cosine magnitude factor $A_{11}, A_{12}, A_{13}$ are a digital sample of the output from a 3-bit ADC.

The above equation can be expanded to ADCs having more than three bits by adding more columns to A (e.g. $A_{14}$, $A_{15}$ etc) and adding corresponding rows to $\hat{x}$.

The values of the output samples in A can therefore have an unknown phase, corresponding to the unknown phase of the analog input signal. The presence of the cosine signal in A acts as a "phase correction" signal and when the equation $\hat{x}(A^T A)^{-1} A^T b = 0$ is solved for $\hat{x}$, the factor $M_c$ will contain the magnitude of the cosine factor for phase-correcting the sinusoid in b. The bit weights in $\hat{x}$ will have been calculated correctly despite the phase difference between b and the samples in A. The factor $M_c$ can thus be discarded as it is not needed in any further calculations to find the bit weights.

Further columns can be added to A to include other factors in the calculation of $\hat{x}$, for example, if there is a constant offset between the input and output of the ADC under test, then this offset can be calculated by inserting of column 1's into A and an (unknown) offset magnitude factor $M_u$ like so:

$$\begin{bmatrix} b_1 \\ b_2 \\ b_3 \\ \vdots \end{bmatrix} = \begin{bmatrix} A_{11} & A_{12} & A_{13} & c_1 & 1 \\ A_{21} & A_{22} & A_{23} & c_2 & 1 \\ A_{31} & A_{32} & A_{33} & c_3 & 1 \\ & & \vdots & & \end{bmatrix} \begin{bmatrix} x_1 \\ x_2 \\ x_3 \\ M_u \\ M_c \end{bmatrix} + e$$

The bit weights will thus be calculated correctly regardless of offset and input signal phase, and the offset will be calculated as $M_o$ in $\hat{x}$. The calculated offset can be used to correct the ADC's operation once the test is over.

Instead of a column of 1's, a column containing an arbitrary constant $M_o$ can be inserted instead. This will change the relative magnitude of the calculated offset factor $M_u$.

The signal generating apparatus shown in FIG. 3 may produce harmonics of the fundamental sinusoidal signal as well as the fundamental itself. These harmonics can be due to component limitations and although they tend to be small in amplitude, they still may affect the output from the ADC under test and may result from non-linearities within the ADC input stage. These harmonics (and factors at any other frequency) can be compensated for in the calculation of $\hat{x}$ by introducing further pairs of sine and cosine columns in A at the frequency of a harmonic, and inserting further magnitude factors into $\hat{x}$. Both sine and cosine columns are required as the phase of the harmonic is not known. Multiple harmonics can be accounted for in this way, and two columns (sine and cosine) are inserted into A for each.

For example if it is desired to eliminate the affects of one harmonic at twice the fundamental frequency, the above equation becomes:

$$\begin{bmatrix} b_1 \\ b_2 \\ b_3 \\ \vdots \end{bmatrix} = \begin{bmatrix} A_{11} & A_{12} & A_{13} & 1 & c_1 & h_{s1} & h_{c1} \\ A_{21} & A_{22} & A_{23} & 1 & c_2 & h_{s2} & h_{c2} \\ A_{31} & A_{32} & A_{33} & 1 & c_3 & h_{s3} & h_{c3} \\ & & & \vdots & & & \end{bmatrix} \begin{bmatrix} x_1 \\ x_2 \\ x_3 \\ M_u \\ M_c \\ M_{hs} \\ M_{hc} \end{bmatrix}$$

where $h_{s1}, h_{s2}, h_{s3}$ is a sine wave at the harmonic $h_{c1}, h_{c2}, h_{c3}$ is a cosine wave at the harmonic $M_{hs}$ is the magnitude of the harmonic sine component, and $M_{hc}$ is the magnitude of the harmonic cosine component.

Factors concerning harmonics, offset and fundamental phase can be included separately within A and need not be introduced together. For example A may include factors for one or more harmonics but not for the fundamental phase or for offset.

Figure 4:
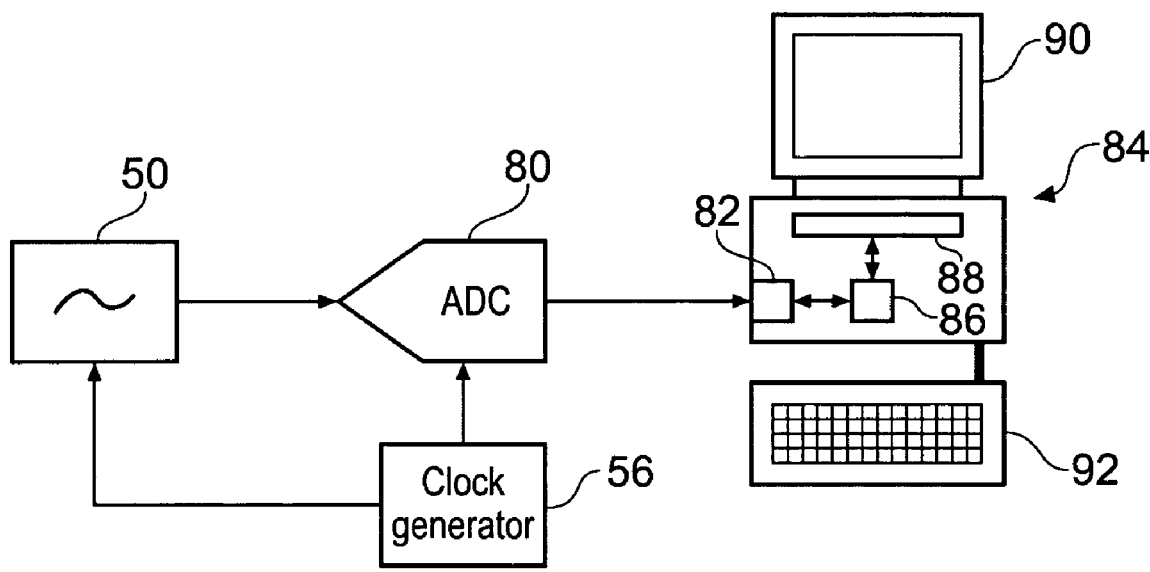
FIG. 4 shows apparatus for testing an ADC.

FIG. 4 shows an apparatus which is suitable for testing an ADC 80 to determine its relative bit weights and other properties such as constant offset. The apparatus 50 which generates a sinusoidal signal of known frequency and unknown but substantially invariant amplitude and phase provides the signal to the ADC 80 under test. The signal generating apparatus 50 and ADC 80 are controlled using a single clock from clock generator 56. The n-bit digital output of the ADC 80 is provided to an interface 82 of a computer 84.

The computer 84 contains a microprocessor 86 which is in communication with the interface 82 and a memory 88. The computer also includes a display device 90 and an input device 92 such as a keyboard.

The computer 84 is able to read sequential digital output samples from the ADC 80. The computer may also therefore respond to the clock signal from the clock generator 56 to capture the ADC output. When testing the ADC 80, the computer 84 stores multiple readings from the ADC 80 to later perform a matrix calculation (as above) in order to determine characteristics of (i.e. characterise) the ADC 80, such as bit weights and offset. The computer 84 may also calculate the extra columns of the A matrix, such as those that contain ADC input sinusoid data ($c_1$, $c_2$, . . . ) and harmonic data (e.g. $h_{c1}$, $h_{c2}$, . . . ).

In alternative embodiments, other signal generation apparatus may be used to supply an input signal to the ADC 80 under test. Other data processing apparatus may be used in place of the computer 84.

It is thus possible to dispense with expensive linear ramp generating equipment for characterising the ADC and instead using a sinusoid as sinusoids are relatively easy to generate.

Once the relative bit weights have been determined these may be used to control trimming components in order to improve the accuracy of the ADC.

So far it has been assumed that the ADC has had sufficient time to settle to a correct value. This may take some time (relatively) depending on the resolution of the converter.

However, analysis by the inventor suggests that settling errors ought to be randomly distributed about the true conversion value and hence on a large number of samples will be almost equivalent to noise, and that the true bit weights will still be determined.

It is known to seek to improve the speed of a successive approximation converter and its ability to recover from an error during a bit trial to include redundant bits.

An example of a converter of this type is disclosed in U.S. Pat. No. 4,814,767 in the name of Analog Devices Inc. This device uses an array of capacitors to both sample an analog input signal and then to allow that signal to be converted into a digital word. The capacitors are nominally binary weighted, but inevitably device physics and manufacturing tolerances lead to some variation from the nominal weights. In order to overcome this, extra capacitors are fabricated, and in this example the weights of the capacitors are in the sequence 1, 2, 2, 4, 8, 8, 16, 32, 64, 64, 128 . . . . The redundant bits in the array make sure that the capacitors in the array which are less significant than the most significant capacitor sum to a value greater than that of the most significant capacitor. This prevents holes occurring in the converter range. The use of redundant bits also enables the conversion speed to be increased since it is not necessary to wait for the capacitors to "settle" to the same extent. Typically a capacitor within a switched capacitor converter will have a time constant associated with it due to the resistance in a current flow path associated with the capacitor. For a successive approximation converter having no redundancy, it is generally necessary to wait for a period of eleven or twelve times the time constant to ensure that the circuit has settled before examining the result of the bit trial. However, in a circuit having redundant capacitors, this time delay can generally be reduced to around two to three times the time constant because settling errors can generally be recovered and corrected for by the subsequent redundant bits within the converter.

The present invention can easily be extended to cope with capacitors having redundant bits. The matrix A is merely extended to include the "raw" bit trial result from the ADC array that is, prior to the bit results being remapped into a binary number.

It is however necessary to distinguish between the bits that have nominally the same weight. This can be achieved in a number of ways. A first way is to switch the redundant bits off during a first characterisation of the ADC. Once this is completed, then the redundant bits may be re-enabled and optionally the bits having the nominally identical weight may be disabled such that the previously disabled bits can be characterised. An alternative approach is to make the redundant bits of a different size such that they lie outside the nominal binary weighted sequence. This can be a permanent size change or the adjustment may be temporary, for example by switching in parallel capacitors of a known or determinable size during characterisation.

Once the bit weights have been determined, the variations from the nominal values may be used to drive compensating devices such as compensating banks of capacitors that can be switched into the main ADC array or fuses that can be blown to add compensating capacitors in parallel with the main capacitors of the ADC array.

Alternatively by being well characterised a mapping can be produced that maps the output of the actual ADC onto the characteristic of an ideal ADC. This can be implemented as post processing of the ADC output and done entirely in the digital domain.

Although the examples presented herein have only considered a 3 bit ADC in order to keep the example simple, the technique extends easily to 12, 16, 18 bits and beyond without requiring any inventive modification. Similarly the technique can be extended to characterise other systems where input and outputs are related by several parameters.

In the embodiment having a sinusoidal test signal, higher order correction factors to account for harmonic components were added to the A matrix. A similar correction can be done for other input signals. Thus for a linear ramp we may assume that any high order deviation will manifest itself as bowing of the ramp. The correction factors should be orthogonal components that can be summed to form a good representation of the bow. Thus a first order correction factor could be applied in the form of a half cycle of a sinusoidal component spanning the length of the ramp. Further correction signals could be added has harmonics of the first order correction factor.

The invention claimed is:

1. A method of characterizing an analog to digital converter, comprising:
   a). An acquisition step comprising supplying an input signal to having a first sinusoidal component to an analog to digital converter and obtaining a plurality of output values therefrom, and
   b). An analysis step comprising examining the output values in order to determine discrepancies due to bit weight errors and obtain estimates of the bit weights or the bit weight errors, wherein discrete representations of the input signal are stored in a column matrix b, output values of the analog to digital converter are stored in a matrix A and the bit weights are represented within a column matrix x, and the bit weights are determined by finding a solution to the matrix equation b=Ax.

2. A method as claimed in claim 1, in which a frequency of the input signal is accurately known.

3. A method as claimed in claim 2, in which an amplitude of the sinusoidal input signal is substantially invariant during a data acquisition step.

4. A method as claimed in claim 1, in which the input signal may contain higher order harmonics at multiples of the frequency of the first sinusoidal component.

5. A method as claimed in claim 4, in which the contributions of higher order harmonics are evaluated and accounted for.

6. A method as claimed in claim 1, in which the bit weights within the column matrix x are evaluated using the equation $\hat{x}(A^TA)^{-1} A^Tb=0$.

7. A method as claimed in claim 1, in which phase shift correction is performed by including a phase shift term in the column matrix x and a representation of a cosine wave at the frequency of the first sinusoidal component in the matrix A.

8. A method as claimed in claim 1, which the presence of a harmonic component within the input signal at H times the frequency of the first sinusoidal component is accounted for by adding a representation of a sine wave at H times the frequency of the first sinusoidal component to the matrix A, and adding a term representing the magnitude of the sine wave to be the column matrix x.

9. A method as claimed in claim 8, further comprising adding a representation of a cosine wave at H times the frequency of the first sinusoidal component to the matrix A, and adding a term representing the magnitude of the cosine wave to the column matrix x.

10. A method as claimed in claim 1, in which DC offset is accounted for by adding a column to A containing a non-zero constant value and a corresponding term in x.

11. A method as claimed in claim 1, in which the estimates of bit weights or bit weight errors are used to derive trimming values for improving the performance of the converter.

12. A method as claimed in claim 11, in which the trimming values are used to improve the linearity of the converter.

13. A computer program product for causing a programmable computer to perform the method of claim 1.

14. A method of trimming an analog to digital converter comprising the steps of:
 a). an acquisition step comprising supplying an input signal to an analog to digital converter and obtaining a plurality of output values therefrom,
 b). comparing the input signal and the output values for a plurality of samples to determine the relative bit weights within the converter by storing a representation of the input signal in a vector b, the output values in a matrix A, and the bit weights of the converter in a vector x and determining the bit weights by solving the equation b=Ax, and
 c). trimming the bits within the converter on the basis of the bit weights.

15. An apparatus for characterising an analog to digital converter, comprising a signal generator for supplying an input signal having a first sinusoidal component to an analog to digital converter and an acquisition device for receiving and storing a plurality of output values from the analog to digital converter, and a data processor arranged to solve the matrix equation b=Ax in order to determine relative bit weights within an analog to digital converter, where a digitized representation of the input signal is stored in array b, the output from the analog to digital converter is stored in array A, and the relative bit weights are stored in array x.

16. An apparatus as claimed in claim 15, in which a frequency of the first sinusoidal component is accurately known.

17. An apparatus as claimed in claim 16, in which the input signal is band pass filtered to attenuate harmonic signals.

18. An apparatus as claimed in claim 15, in which a magnitude of the input signal is substantially invariant during a data acquisition.

19. An apparatus as claimed in claim 15, further arranged to evaluate at least one of the contributions of harmonics and other unwanted components and to account for them.

20. An apparatus arranged to solve an equation b=Ax in order to determine the relative bit weights within an analog to digital converter which receives and converts an input signal, wherein a digitized representation of the input signal is stored in an array b, the output from the analog to digital converter is stored in an array A, and the bit weights are stored in an array x.

21. An apparatus as claimed in claim 20, further arranged to compensate for a phase shift in a band pass filter by adding a cosine representation of the input signal in array A and a phase shift term in array x.

22. An apparatus as claimed in claim 20, further arranged to compensate for offsets by adding a column to A containing a constant non-zero value and a corresponding offset term in array x.

23. An apparatus as claimed in claim 20, further arranged to compensate for harmonic components by adding a column to A representing a harmonic component and corresponding terms in x.

24. An apparatus as claimed in claim 20, wherein the apparatus is arranged to find a least squares solution to the equation b=Ax.

* * * * *